US006315649B1

United States Patent
Hu et al.

(12) United States Patent
(10) Patent No.: US 6,315,649 B1
(45) Date of Patent: Nov. 13, 2001

(54) WAFER MOUNTING PLATE FOR A POLISHING APPARATUS AND METHOD OF USING

(75) Inventors: Tien-Chen Hu, Ping-tung; Tsen-Hsing Yi, Chia-yi; Chien-Hsien Lee, Hsin-chu; Ming-Yi Lee, Chia-yi, all of (TW)

(73) Assignee: Taiwan Semiconductor Manufacturing Company Ltd, Hsin Chu (TW)

( * ) Notice: Subject to any disclaimer, the term of this patent is extended or adjusted under 35 U.S.C. 154(b) by 0 days.

(21) Appl. No.: 09/451,266

(22) Filed: Nov. 30, 1999

(51) Int. Cl.[7] .................................................... B24B 29/00
(52) U.S. Cl. .......................... 451/285; 451/28; 451/41; 451/287; 451/289; 451/397; 451/398
(58) Field of Search ................................ 451/28, 41, 285, 451/287, 288, 289, 397, 398

(56) References Cited

U.S. PATENT DOCUMENTS

| | | | |
|---|---|---|---|
| 4,918,869 | * | 4/1990 | Kitta ...................................... 451/288 |
| 5,885,135 | * | 3/1999 | Desorcie et al. ........................ 451/41 |
| 5,913,719 | * | 6/1999 | Hasegawa et al. ................... 451/364 |
| 6,113,466 | * | 9/2000 | Lin ......................................... 451/41 |

* cited by examiner

Primary Examiner—Joseph J. Hail, III
Assistant Examiner—Shantese McDonald
(74) Attorney, Agent, or Firm—Tung & Associates

(57) ABSTRACT

A wafer mounting plate for mounting a wafer in a chemical mechanical polishing process and a method for using the wafer mounting plate are disclosed. The novel mounting plate for a silicon wafer is designed to incorporate a concave mounting surface for contacting a wafer with a flexible membrane layer thereinbetween. The wafer mounting plate is further provided with a plurality of apertures therethrough for use as vacuum passageways for picking up a wafer through a perforated or breathable membrane layer. The concave surface of the wafer mounting plate that contacts the wafer substantially eliminates stress concentration problems imposed on the wafer by conventional wafer mounting plates. The present invention novel apparatus therefore not only eliminates the edge defect problem that is normally associated with the conventional mounting plates, but further solves the wafer breakage problem frequently caused by stress concentration imposed on the wafer by a bumper ring. The present invention further discloses a method for using a wafer mounting plate during a chemical mechanical polishing process which does not create stress concentration on the wafer and therefore provides a safe and reliable method for loading/unloading a wafer from a load cup, or chucking or dechucking a wafer from a polishing pad.

26 Claims, 3 Drawing Sheets

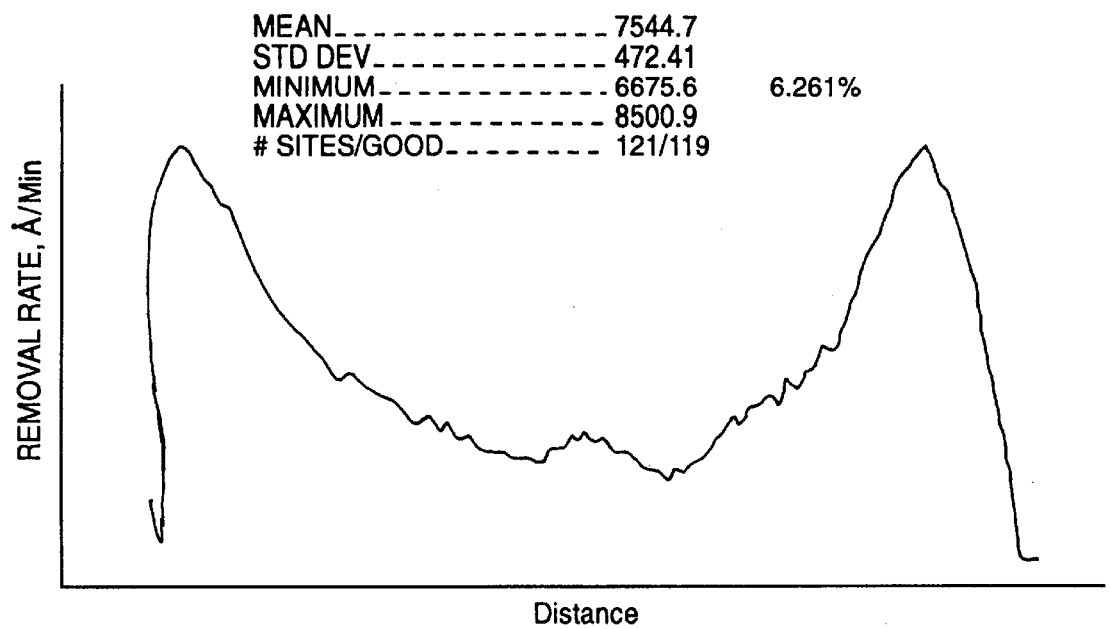
FIG.1D
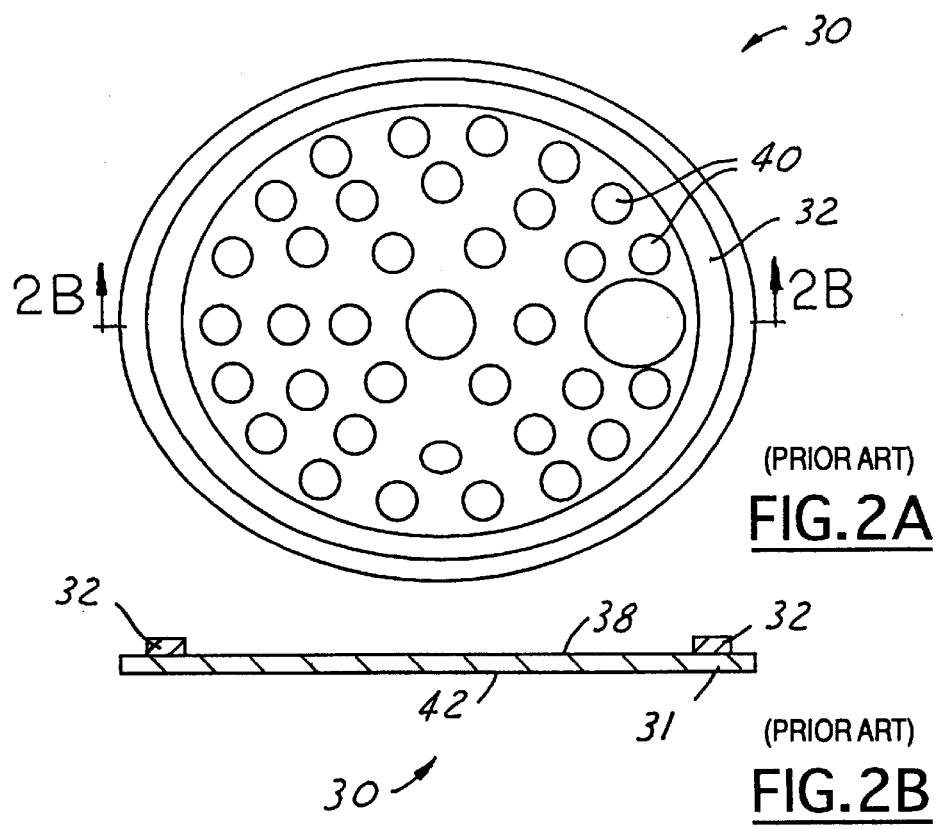
(PRIOR ART)
FIG.2A
(PRIOR ART)
FIG.2B

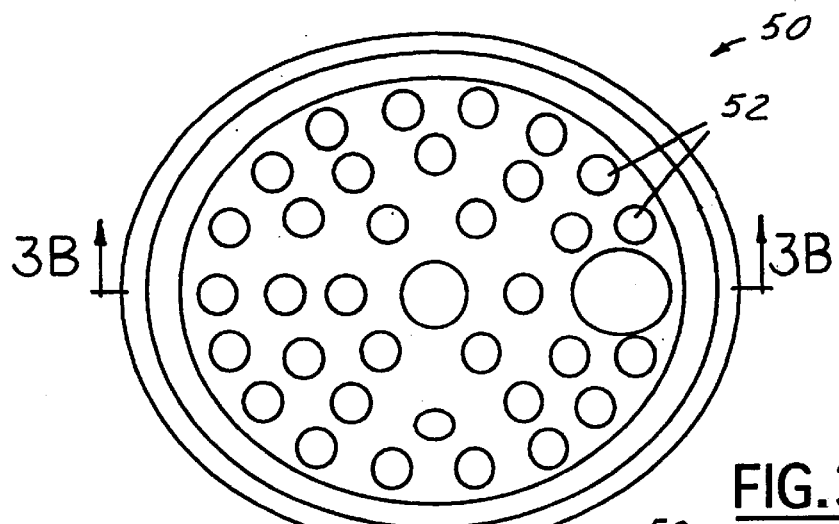
FIG. 3A
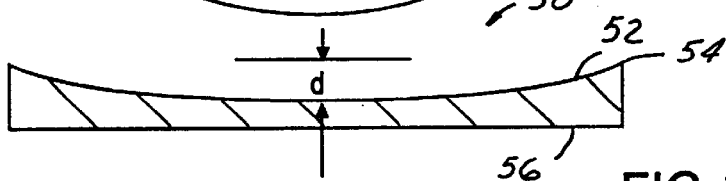
FIG. 3B
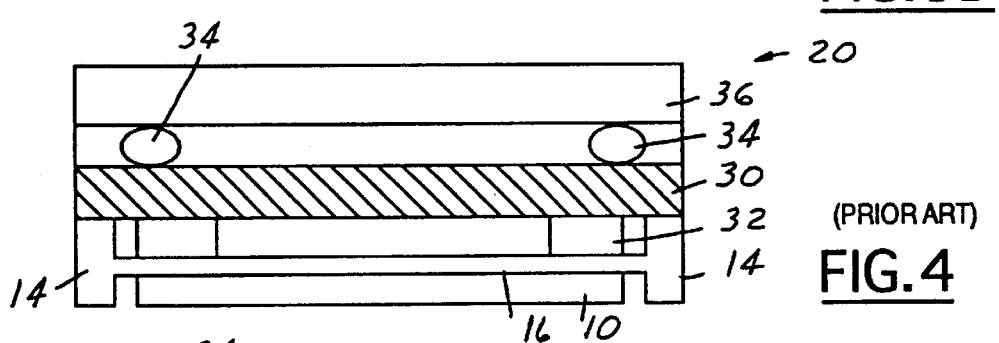
(PRIOR ART) FIG. 4
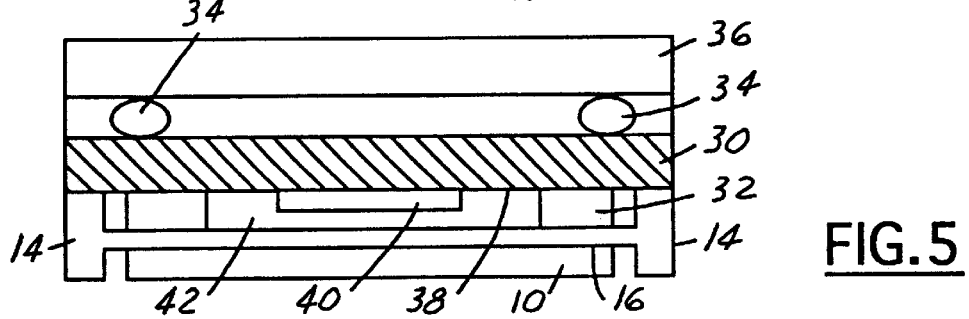
FIG. 5
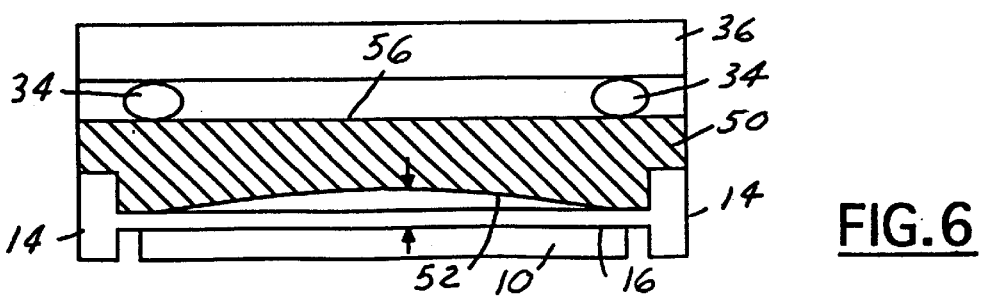
FIG. 6

WAFER MOUNTING PLATE FOR A POLISHING APPARATUS AND METHOD OF USING

FIELD OF THE INVENTION

The present invention generally relates to a wafer mounting plate for a polishing apparatus and a method for using and more particularly, relates to a wafer mounting plate for use in a chemical mechanical polishing apparatus that is provided with a concave bottom surface adapted for contacting a wafer backside through a flexible membrane member such that a uniform pressure may be exerted on the wafer without stress concentration and possible damages to the wafer during loading and unloading and a method for using such wafer mounting plate.

BACKGROUND OF THE INVENTION

Apparatus for polishing thin, flat semi-conductor wafers is well-known in the art. Such apparatus normally includes a polishing head which carries a membrane for engaging and forcing a semiconductor wafer against a wetted polishing surface, such as a polishing pad. Either the pad, or the polishing head is rotated and oscillates the wafer over the polishing surface. The polishing head is forced downwardly onto the polishing surface by a pressurized air system or, similar arrangement. The downward force pressing the polishing head against the polishing surface can be adjusted as desired. The polishing head is typically mounted on an elongated pivoting carrier arm, which can move the pressure head between several operative positions. In one operative position, the carrier arm positions a wafer mounted on the pressure head in contact with the polishing pad. In order to remove the wafer from contact with the polishing surface, the carrier arm is first pivoted upwardly to lift the pressure head and wafer from the polishing surface. The carrier arm is then pivoted laterally to move the pressure head and wafer carried by the pressure head to an auxiliary wafer processing station. The auxiliary processing station may include, for example, a station for cleaning the wafer and/or polishing head; a wafer unload station; or, a wafer load station.

More recently, chemical-mechanical polishing (CMP) apparatus has been employed in combination with a pneumatically actuated polishing head. CMP apparatus is used primarily for polishing the front face or device side of a semiconductor wafer during the fabrication of semiconductor devices on the wafer. A wafer is "planarized" or smoothed one or more times during a fabrication process in order for the top surface of the wafer to be as flat as possible. A wafer is polished by being placed on a carrier and pressed face down onto a polishing pad covered with a slurry of colloidal silica or alumina in de-ionized water.

A schematic of a typical CMP apparatus is shown in FIGS. 1A and 1B. The apparatus 10 for chemical mechanical polishing consists of a rotating wafer holder 14 that holds the wafer 10, the appropriate slurry 24, and a polishing pad 12 which is normally mounted to a rotating table 26 by adhesive means. The polishing pad 12 is applied to the wafer surface 22 at a specific pressure. The chemical mechanical polishing method can be used to provide a planar surface on dielectric layers, on deep and shallow trenches that are filled with polysilicon or oxide, and on various metal films. CMP polishing results from a combination of chemical and mechanical effects. A possible mechanism for the CMP process involves the formation of a chemically altered layer at the surface of the material being polished. The layer is mechanically removed from the underlying bulk material. An altered layer is then regrown on the surface while the process is repeated again. For instance, in metal polishing a metal oxide may be formed and removed repeatedly.

A polishing pad is typically constructed in two layers overlying a platen with the resilient layer as the outer layer of the pad. The layers are typically made of polyurethane and may include a filler for controlling the dimensional stability of the layers. The polishing pad is usually several times the diameter of a wafer and the wafer is kept off-center on the pad to prevent polishing a non-planar surface onto the wafer. The wafer is also rotated to prevent polishing a taper into the wafer. Although the axis of rotation of the wafer and the axis of rotation of the pad are not collinear, the axes must be parallel. Polishing heads of the type described above used in the CMP process are shown in U.S. Pat. Nos. 4, 141180 to Gill, Jr., et al.; 5, 205, 082 to Shendon et al; and, 5, 643,061 to Jackson, et al. It is known in the art that uniformity in wafer polishing is a function of pressure, velocity and the concentration of chemicals. Edge exclusion is caused, in part, by non-uniform pressure on a wafer. The problem is reduced somewhat through the use of a retaining ring which engages the polishing pad, as shown in the Shendon et al patent.

Referring now to FIG. 1C, wherein an improved CMP head, sometimes referred to as a Titan® head which differs from conventional CMP heads in two major respects is shown. First, the Titan® head employs a compliant wafer carrier and second, it utilizes a mechanical linkage (not shown) to constrain tilting of the head, thereby maintaining planarity relative to a polishing pad 12, which in turn allows the head to achieve more uniform flatness of the wafer during polishing. The wafer 10 has one entire face thereof engaged by a flexible membrane 16, which biases the opposite face of the wafer 10 into face-to-face engagement with the polishing pad 12. The polishing head and/or pad 12 are moved relative to each other, in a motion to effect polishing of the wafer 10. The polishing head includes an outer retaining ring 14 surrounding the membrane 16, which also engages the polishing pad 12 and functions to hold the head in a steady, desired position during the polishing process. As shown in FIG. 1C, both the retaining ring 14 and the membrane 16 are urged downwardly toward the polishing pad 12 by a linear force indicated by the numeral 18 which is effected through a pneumatic system.

In the improved CMP head 20 shown in FIG. 1C, large variations in the removal rate, or polishing rate, across the whole wafer area are frequently observed. A thickness variation across the wafer is therefore produced as a mean cause for wafer non-uniformity. The improved CMP head design, even though utilizing a pneumatic system to force a wafer surface onto a polishing pad, the pneumatic system cannot selectively apply different pressure at different locations on the surface of the wafer. For instance, as shown in FIG. 1D, a profilometer data obtained on an 8-inch wafer is shown. The thickness difference between the highest point on the wafer and the lowest point on the wafer is almost 2,000 Å yielding a standard deviation of 472 Å or 6.26%. The curve shown in FIG. 1D is plotted with the removal rates in the vertical axis and the distance from the center of the wafer in the horizontal axis. It is seen that the removal rates at the edges of the wafer are substantially higher than the removal rate at or near the center of the wafer. The thickness uniformity on the resulting wafer after the CMP process is therefore very poor.

A more detailed cross-sectional view of the improved CMP 20 is shown in FIG. 4. The CMP head 20 further includes a wafer mounting plate 30, a bumper ring 32, an inner tube 34 for supplying the pneumatic force 18 (shown in FIG. 1C) and a base plate 36. The bumper ring 32 is utilized between the wafer 10 and the mounting plate 30 for preventing edge defect by raising the edges of wafer 10 when pressed down onto a polishing pad (not shown). Without the use of the bumper ring 32, the edge portion of the wafer 10 is not polished to the same degree as the center portion of the wafer 10 and therefore, the bumper ring 32 compensates for the poor polishing along the edges of wafer 10 by providing a support behind the wafer. Both the bumper ring 32 and the wafer mounting plate 30 are normally fabricated of a rigid material such as plastic or ceramic. The wafer mounting plate 30 is further provided with a plurality of through holes 40, as shown in FIG. 2A.

FIGS. 2A and 2B illustrate a plane view and a side view, respectively of the wafer mounting plate 30 shown in FIG. 4. The plurality of through holes 40, or apertures, are provided for fluid communication between an upper surface 38 and a lower surface 42 of the wafer mounting plate 30 which enables a vacuum to be exerted on the wafer 10 when positioned thereunder. It should be noted that the flexible membrane member 16, shown in FIG. 4, is not shown in FIGS. 2A and 2B for simplicity reasons. The flexible membrane member 16 may be fabricated of a breathable material, or a material that is perforated such that vacuum can be pulled on the membrane member for acting on the wafer surface. The flexible member 16 may be advantageously fabricated of an elastomeric material, such as a silicon rubber, a polyurethane rubber or any other high temperature and chemical resistant rubber that does not cause particle contamination.

In the configuration shown in FIGS. 2A, 2B and 4, the wafer mounting plate 30 when used to mount wafer 10 frequently encounters a wafer breakage problem since both the mounting plate 30 and the bumper ring 32 are fabricated of rigid materials and thus causing a stress concentration on the wafer it carries. The breakage of the wafer frequently occurs during a wafer loading or unloading from a load cup, or during wafer chuck or dechuck from a polishing pad. When the breakage occurs, the throughput of the fabrication process is severely affected.

In modern semiconductor devices wherein multi-level interconnects are frequently formed by a plug process, the successful implementation of a CMP process on either tungsten or copper becomes a critical processing step. Frequent wafer breakage problem due to stress concentration imposed by the wafer mounting plate and the bumper ring is therefore unacceptable. It has been found that stress concentration is the single most important reason that causes wafer breakage during loading or unloading of wafer from a carrier head.

It is therefore an object of the present invention to provide an apparatus for mounting a wafer in a chemical mechanical polishing apparatus that does not have the drawbacks or shortcomings of the conventional mounting apparatus.

It is another object of the present invention to provide an apparatus for mounting a wafer in a chemical mechanical polishing process that does not cause wafer breakage problem during loading or unloading of wafers.

It is a further object of the present invention to provide a wafer mounting plate for use in a chemical mechanical polishing apparatus which has a concave surface for contacting a wafer that does not cause stress concentration on the wafer surface.

It is another further object of the present invention to provide an apparatus for mounting a wafer in a chemical mechanical polishing apparatus which is a single piece mounting plate instead of a two-piece mounting plate/bumper ring.

It is yet another object of the present invention to provide a wafer mounting plate for use in a chemical mechanical polishing apparatus which has a concave surface for eliminating stress concentration on a wafer when the wafer is picked up and a plurality of apertures through which a vacuum may be exerted on the wafer.

It is still another further object of the present invention to provide a method for holding a wafer during a polishing process without creating stress concentration on the wafer by using a wafer mounting plate that has a concave surface for contacting the wafer without causing stress concentration.

It is yet another further object of the present invention to provide a method for holding a wafer during a chemical mechanical polishing process that is equipped with a concave surface for contacting a wafer without causing stress concentration and a plurality of apertures through which a vacuum may be exerted on the wafer.

SUMMARY OF THE INVENTION

In accordance with the present invention, an apparatus for mounting a substrate in a polishing process and a method for using such apparatus are disclosed.

In a preferred embodiment, an apparatus for mounting a substrate in a polishing process is provided which includes a substrate mounting head that has a recessed opening therein adapted for holding a substrate and for exposing a surface of the substrate to be polished, and a substrate mounting plate that has a diameter substantially similar to the substrate for fitting inside the recessed opening and for positioning between the substrate and the mounting head, the mounting plate has a planar top surface and a concave bottom surface adapted for contacting a substrate backside through a flexible membrane member such that a uniform pressure can be exerted on the substrate without stress concentration and damage to the substrate during loading and unloading.

In the apparatus for mounting a substrate for a polishing process, the mounting plate may be provided with a plurality of through holes for vacuum passageways. The apparatus may further include a retaining ring removably mounted to the substrate mounting plate adapted for holding the flexible membrane member and the substrate therein. The mounting plate and the flexible membrane member are provided with a plurality of through holes for vacuum passageways. The concave bottom surface of the mounting plate may have a maximum deflection at a center measured from a plane taken along a peripheral edge of the surface of less than 2.5 mm. The concave bottom surface of the mounting plate may hold a substrate therein during a polishing process effective in preventing an edge defect during polishing. The polishing process conducted may be a chemical mechanical polishing process.

The present invention is further directed to a method for holding a wafer during a polishing process without creating stress concentration on the wafer that can be carried out by the operating steps of providing a wafer mounting head that has a recessed opening, mounting a wafer mounting plate inside the recessed opening, the wafer mounting plate has a diameter substantially similar to the wafer, a planar top surface for mating to the wafer mounting head, a concave bottom surface for mating to a wafer and a plurality of through holes as vacuum passageways, positioning a perforated, flexible membrane member on the concave bottom surface, and mounting a wafer in the recessed opening of the wafer mounting head wherein the concave bottom surface exerts a uniform vacuum force on the wafer thus eliminating stress concentration and damages in the wafer during loading/unloading.

The method for holding a wafer during a polishing process without creating stress concentration on the wafer may further include the step of mounting the wafer in the mounting head such that no edge defect occurs during polishing. The method may further include the step of mounting a silicon wafer in the recessed opening of the wafer mounting head. The method may further include the step of forming the concave bottom surface with a curvature that measures a maximum deflection from a plane of the peripheral edge of the surface to less than 2.5 mm. The method may further include the step of pressing the wafer mounted in the wafer mounting head against a rotating polishing pad. The method may further include the step of supplying a vacuum to the plurality of through holes in the wafer mounting plate for picking up a wafer. The method may further include the step of loading or unloading a wafer into or from a load cup in a chemical mechanical polishing apparatus, or the step of chucking or dechucking a wafer into or from a polishing pad in a chemical mechanical polishing apparatus.

In another preferred embodiment, a wafer mounting device for use in a chemical mechanical polishing apparatus without causing stress concentration in the wafer is provided which includes a wafer mounting head that has a recessed opening and a recessed surface therein, a wafer mounting plate that has a diameter substantially similar to a wafer adapted for mounting inside the recessed opening by intimately abutting the recessed surface on a top surface of the plate, the wafer mounting plate may further have a concave bottom surface for receiving a wafer by abutting a wafer backside and a plurality of through holes providing fluid communication between the top surface and the concave bottom surface of the plate, and a breathable, flexible membrane member positioned between the concave bottom surface of the mounting plate and a wafer backside wherein the concave bottom surface applies a substantially uniform vacuum force on the wafer backside to avoid stress concentration and damages to the wafer.

In the wafer mounting device for use in the chemical mechanical polishing apparatus, the concave bottom surface of the mounting plate may have a maximum deflection at a center measured from a plane taken along a peripheral edge of the surface of less than 2.5 mm. The apparatus may further include a retaining ring removably mounted to the wafer mounting plate adapted for holding the flexible membrane member and the wafer therein. The concave bottom surface of the mounting plate holds a wafer therein during a polishing process effectively preventing edge defect from occurring. The apparatus may further include a vacuum source for supplying a vacuum to the plurality of through holes in the wafer mounting plate for picking up a wafer into the wafer mounting device.

BRIEF DESCRIPTION OF THE DRAWINGS

These and other objects, features and advantages of the present invention will become apparent from the following detailed description and the appended drawings in which:

FIG. 1D is a graph illustrating the deterioration in removal rates after successive usage of a polishing pad that is conditioned by a diamond conditioning disc.

FIG. 2A is a plane view of a conventional wafer mounting plate used in a polishing head for a CMP apparatus.

FIG. 2B is a cross-sectional view of the wafer mounting plate of FIG. 2A.

FIG. 3A is a plane view of the present invention wafer mounting plate.

FIG. 3B is a cross-sectional view showing the concave surface of the present invention wafer mounting plate of FIG. 3A.

FIG. 4 is a cross-sectional view of a conventional wafer mounting head utilizing a flat wafer mounting plate and a bumper ring.

FIG. 5 is a cross-sectional view of a modified wafer mounting head utilizing a buffer pad.

FIG. 6 is a cross-sectional view of the present invention wafer mounting head utilizing a wafer mounting plate equipped with a bottom concave surface.

DETAILED DESCRIPTION OF THE PREFERRED EMBODIMENT

Figure 1A:
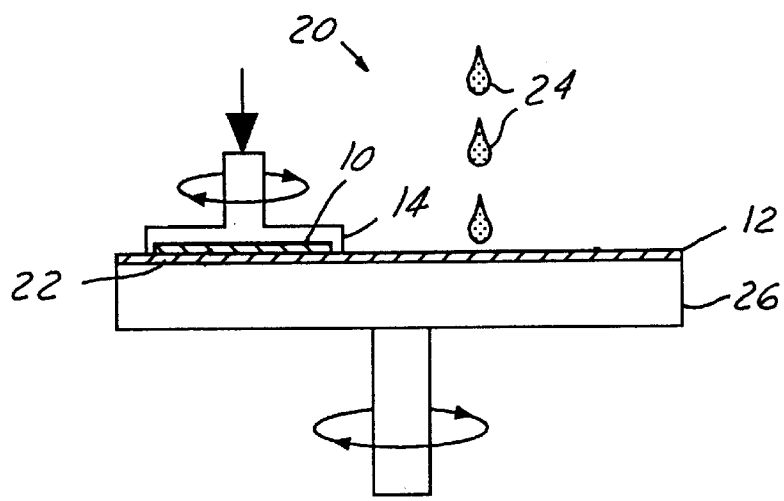
FIG. 1A is a schematic of a cross-sectional view of a conventional chemical mechanical polishing apparatus.
Figure 1B:
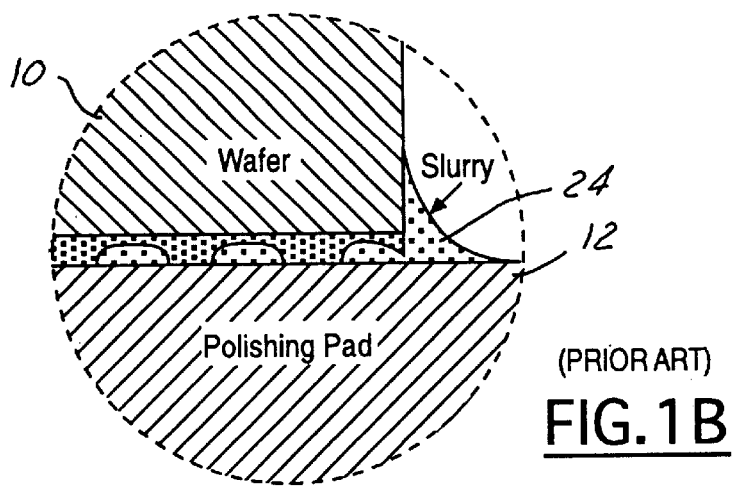
FIG. 1B is an enlarged, partial cross-sectional view of the wafer and the polishing pad of FIG. 1A.
Figure 1C:
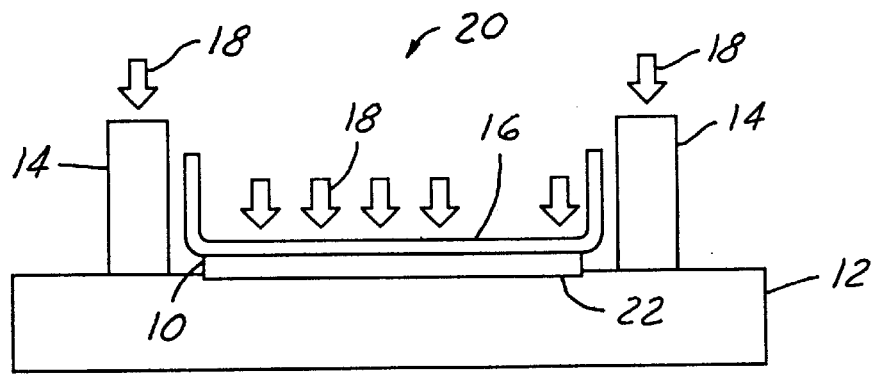
FIG. 1C is a cross-sectional view of an improved polishing head for a CMP apparatus.

The present invention discloses a wafer mounting plate for a polishing apparatus and a method for using such mounting plate. The wafer mounting plate is mounted in a wafer mounting head which has a recessed opening for accommodating the plate and a wafer while exposing a surface of the wafer to be polished. The wafer mounting plate is provided in a diameter that is substantially similar to the diameter of the wafer such that it fits snugly inside the recessed opening and can be positioned between the wafer and the mounting head. The wafer mounting plate is fabricated with a planar top surface and a concave bottom surface adapted for contacting a wafer backside through a flexible membrane member so that a uniform vacuum pressure can be applied on the wafer during loading/unloading of the wafer without causing stress concentration and possible breakage of the wafer during such operations.

The invention also discloses a method for holding a wafer during a chemical mechanical polishing process without creating stress concentration on the wafer which utilizes a wafer mounting plate positioned inside a wafer mounting head, the wafer mounting plate is provided with a planar top surface for mating to the wafer mounting head and a concave bottom surface for mating to a wafer. The wafer mounting plate is further provided with a plurality of apertures (or through holes) as vacuum passageways. A wafer is then mounted in the wafer mounting head juxtaposed to the concave surface on the wafer mounting plate with a flexible membrane positioned thereinbetween. The flexible membrane member is provided with a breathable feature or is perforated such that the wafer can be picked up by vacuum exerted on the flat side of the wafer mounting plate.

While the present invention novel apparatus and method are illustrated by way of an example of chemical mechanical polishing process, the invention is in no way limited only to such process. The invention can be utilized in any polishing applications wherein a substrate of brittle nature must be picked up and held in place while a mechanical deformation is performed on the substrate without causing stress concentration and possible breakage of the substrate.

The curvature in the concave surface of the wafer mounting plate can be suitable selected to suit each individual application. In the various tests performed in the present invention, the concave bottom surface of the wafer mounting plate has a maximum deflection (or distance) at a center measured from a plane taken along a peripheral edge of the surface of less than 2.5 mm (0.1 inch) for a 300 mm diameter silicon wafer.

Referring now to FIG. 5, wherein a simulated present invention wafer mounting plate 30 is shown. On the bottom surface 38 of the wafer mounting plate 30, a buffer pad 40 of a circular or a square shape is fixed. The thickness of the buffer pad 40 is selected to partially fill the gap 42 formed by the bumper ring 32 between the wafer mounting plate 30 and the flexible membrane member 16. For instance, when the bumper ring 32 has a height of approximately 30 mil, the thickness of the buffer pad 40 is approximately 10 mil.

The present invention simulated wafer mounting plate 30 equipped with the buffer pad 40 is used as a model apparatus to demonstrate the feasibility of the present invention plate 50 (shown in FIG. 6) that has a concave surface 52. By utilizing the simulated wafer mounting plate equipped with the buffer pad 40, the feasibility of the present invention novel concave surfaced mounting plate can be proven. The function of the buffer pad 40, shown in FIG. 5, is to take up part of the gap 42 formed by the bumper ring 32 such that subsequent stress concentration imposed on wafer 10 can be reduced.

After the concept of the present invention concave surface wafer mounting plate 50 is proven, the wafer mounting plate is fabricated in a rigid material such as a high temperature plastic, a ceramic material or a metallic material. A plane view and a side view of the present invention wafer mounting plate 50 is further shown in FIGS. 3A and 3B, respectively. The present invention wafer mounting plate 50 can be molded in a plastic or ceramic material, or machined from a metallic material with a plurality of apertures 52 (or through holes) for acting as vacuum passageways. The concave bottom surface (shown in a face-up position in FIG. 3) of FIG. 6 is designed such that a maximum deflection "d" (or distance) at the center of the plate between the concave surface and a plane taken along a peripheral edge 54 of the surface 52 is less than 2.5 mm for a 300 mm diameter mounting plate for mounting a 300 mm diameter silicon wafer. The deflection "d" can be suitably selected based on several parameters, i.e., the vacuum force applied to the top side 56 of the mounting plate 50, the nature of the substrate that the plate is designed to pick up, the size and location of the apertures 52 and the speed of the pick up. The deflection "d" once suitable selected to determine the curvature of the concave surface 52, the wafer breakage problem or other possible damages to the wafer can be avoided.

The present invention novel apparatus for mounting a wafer in a chemical mechanical polishing head and a method for using the apparatus have therefore been amply described in the above descriptions and in the appended drawings of FIGS. 3A, 3B, 5 and 6.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows:

1. An apparatus for mounting a substrate in a polishing process comprising:
   a substrate mounting head having a recessed opening therein adapted for holding a substrate and exposing a surface to be polished, and
   a substrate mounting plate having a diameter substantially similar to said substrate for fitting inside said recessed opening and for positioning between said substrate and said mounting head, said mounting plate is fabricated in a rigid material selected from the group consisting of a high temperature plastic, a ceramic material and a metallic material, and having a planar top surface and a concave bottom surface adapted for contacting a substrate backside through a flexible membrane member such that a uniform pressure is exerted on said substrate without stress concentration on said substrate during loading and unloading.

2. An apparatus for mounting a substrate for a polishing process according to claim 1, wherein said mounting plate being provided with a plurality of through holes for vacuum passageways.

3. An apparatus for mounting a substrate for a polishing process according to claim 1 further comprising a retaining ring removably mounted to said substrate mounting plate adapted for holding said flexible membrane member and said substrate therein.

4. An apparatus for mounting a substrate for a polishing process according to claim 1, wherein said mounting plate and said flexible membrane member are provided with a plurality of through holes for vacuum passageways.

5. An apparatus for mounting a substrate for a polishing process according to claim 1, wherein said concave bottom surface of said mounting plate having a maximum deflection at a center measured from a plane taken along a peripheral edge of the surface of less than 2.5 mm.

6. An apparatus for mounting a substrate for a polishing process according to claim 1, wherein said concave bottom surface of said mounting plate holds a substrate therein during a polishing process effective in preventing an edged defect during polishing.

7. An apparatus for mounting a substrate for a polishing process according to claim 1, wherein said polishing process conducted is a chemical mechanical polishing process.

8. A method for holding a wafer during a polishing process without creating stress concentration on the wafer comprising the steps of:
   providing a wafer mounting head having a recessed opening,
   mounting a wafer mounting plate inside said recessed opening, said wafer mounting plate having a diameter substantially similar to said wafer, a planar top surface for mating to said wafer mounting head, a concave bottom surface for mating to a wafer and a plurality of through holes as vacuum passageways.

9. A method for holding a wafer during a polishing process without creating stress concentration on the wafer according to claim 8 further comprising the step of mounting said wafer in said mounting head such that no edge defect occurs during polishing.

10. A method for holding a wafer during a polishing process without creating stress concentration on the wafer according to claim 8 further comprising the step of mounting a silicon wafer in said recessed opening of the wafer mounting head.

11. A method for holding a wafer during a polishing process without creating stress concentration on the wafer according to claim 8 further comprising the step of forming said concave bottom surface with a curvature that measures a maximum deviation from a plane of the peripheral edge of the surface of less than 2.5 mm.

12. A method for holding a wafer during a polishing process without creating stress concentration on the wafer according to claim 8 further comprising the step of pressing said wafer mounted in said wafer mounting head against a rotating polishing pad.

13. A method for holding a wafer during a polishing process without creating stress concentration on the wafer according to claim 8 further comprising the step of supplying a vacuum to the plurality of through holes in said wafer mounting plate for picking up a wafer.

14. A method for holding a wafer during a polishing process without creating stress concentration on the wafer according to claim 8 further comprising the step of loading or unloading a wafer into or from a lead cup in a chemical mechanical polishing apparatus.

15. A method for holding a wafer during a polishing process without creating stress concentration on the wafer according to claim 8 further comprising the step of chucking or dechucking a wafer into or from a polishing pad in a chemical mechanical polishing apparatus.

16. A wafer mounting device for use in a chemical mechanical polishing apparatus without causing stress concentration in the wafer comprising:

a wafer mounting head having a recessed opening and a recessed surface therein, a wafer mounting plate having a diameter substantially similar to a wafer adapted for mounting inside said recessed opening by intimately abutting said recessed surface on a top surface of the plate, said wafer mounting plate further having a concave bottom surface for receiving a wafer by abutting a wafer backside and a plurality of through holes providing fluid communication between said top surface and sad concave bottom surface of the plate, and a breathable, flexible membrane member positioned between said concave bottom surface of the mounting plate and a wafer backside, wherein aid concave bottom surface applies a substantially uniform vacuum pressure on said wafer backside to avoid stress concentration on said wafer.

17. A wafer mounting device for use in a chemical mechanical polishing apparatus without causing stress concentration in the wafer according to claim 16, wherein said concave bottom surface of said mounting plate having a maximum deflection at a center measured from a plane taken along a peripheral edge of the surface of less than 2.5 mm.

18. A wafer mounting device for use in a chemical mechanical polishing apparatus without causing stress concentration in the wafer according to claim 16 further comprising a retaining ring removably mounted to said wafer mounting plate adapted for holding said flexible membrane member and said wafer therein.

19. A wafer mounting device for use in a chemical mechanical polishing apparatus without causing stress concentration in the wafer according to claim 16, wherein said concave bottom surface of said mounting plate holds a substrate therein during a polishing process effective in preventing an edged defect during polishing.

20. A wafer mounting device for use in a chemical mechanical polishing apparatus without causing stress concentration in the wafer according to claim 16 further comprising a vacuum source for supplying a vacuum to said plurality of through holes in said wafer mounting plate for picking up a wafer into said wafer mounting device.

21. An apparatus for mounting a substrate in a polishing process comprising:

a substrate mounting head having a recessed opening therein adapted for holding a substrate and exposing a surface to be polished, and a substrate mounting plate having a diameter substantially similar to said substrate for fitting inside said recessed opening and for positioning between said substrate and said mounting head, said mounting plate having a planar top surface and a concave bottom surface adapted for contacting a substrate backside through a flexible membrane member such that a uniform pressure is exerted on said substrate without stress concentration on said substrate during loading and unloading, said mounting plate being provided with a plurality of through holes for vacuum passageways.

22. An apparatus for mounting a substrate for a polishing process according to claim 21 further comprising a retaining ring removably mounted to said substrate mounting plate adapted for holding said flexible membrane member and said substrate therein.

23. An apparatus for mounting a substrate for a polishing process according to claim 21, wherein said mounting plate and said flexible membrane member are provided with a plurality of through holes for vacuum passageways.

24. An apparatus for mounting a substrate for a polishing process according to claim 21, wherein said concave bottom surface of said mounting plate having a maximum deflection at a center measured from a plane taken along a peripheral edge of the surface of less than 2.5 mm.

25. An apparatus for mounting a substrate for a polishing process according to claim 21, wherein said concave bottom surface of said mounting plate holds a substrate therein during a polishing process effective in preventing an edged defect during polishing.

26. An apparatus for mounting a substrate for a polishing process according to claim 21, wherein said polishing process conducted is a chemical mechanical polishing process.

* * * * *